United States Patent
Takeichi

(10) Patent No.: US 10,367,119 B2
(45) Date of Patent: Jul. 30, 2019

(54) METHOD OF MANUFACTURING LIGHT-EMITTING DEVICE

(71) Applicant: NICHIA CORPORATION, Anan-shi, Tokushima (JP)

(72) Inventor: Junji Takeichi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/854,289

(22) Filed: Dec. 26, 2017

(65) Prior Publication Data

US 2018/0182924 A1 Jun. 28, 2018

(30) Foreign Application Priority Data

Dec. 27, 2016 (JP) .................. 2016-254287

(51) Int. Cl.
*H01L 33/44* (2010.01)
*H01L 33/30* (2010.01)
*H01L 33/48* (2010.01)
*H01L 33/56* (2010.01)
*H01L 33/62* (2010.01)
*H01L 33/50* (2010.01)
*H01L 33/38* (2010.01)

(52) U.S. Cl.
CPC .............. *H01L 33/44* (2013.01); *H01L 33/30* (2013.01); *H01L 33/382* (2013.01); *H01L 33/486* (2013.01); *H01L 33/50* (2013.01); *H01L 33/505* (2013.01); *H01L 33/56* (2013.01); *H01L 33/62* (2013.01); *H01L 2224/16225* (2013.01); *H01L 2933/0025* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2008/0108159 A1 | 5/2008 | Ajiki et al. | |
| 2009/0117672 A1* | 5/2009 | Caruso | H01L 33/505 438/7 |
| 2011/0210367 A1* | 9/2011 | Kim | H01L 33/507 257/98 |
| 2011/0215348 A1* | 9/2011 | Trottier | F21V 9/08 257/89 |
| 2012/0244652 A1* | 9/2012 | Chen | H01L 33/505 438/27 |

FOREIGN PATENT DOCUMENTS

| | | |
|---|---|---|
| JP | H11-31845 A | 2/1999 |
| JP | 2007-116035 A | 5/2007 |
| JP | 2008-117976 | 5/2008 |
| JP | 2008-130674 A | 6/2008 |

* cited by examiner

*Primary Examiner* — Asok K Sarkar
(74) *Attorney, Agent, or Firm* — Hunton Andrews Kurth LLP

(57) ABSTRACT

A method of manufacturing a light-emitting device includes: providing a light-emitting element, the light-emitting element comprising a layered semiconductor partially comprising an active layer in a plan view; mounting the light-emitting element on a supporting member; forming a phosphor layer so as to cover the light-emitting element; determining a surplus portion of the phosphor layer; and removing at least a portion of the phosphor layer in a region in the plan view in which the active layer is not disposed.

8 Claims, 10 Drawing Sheets

METHOD OF MANUFACTURING LIGHT-EMITTING DEVICE

CROSS-REFERENCE TO RELATED APPLICATION

This application claims priority to Japanese Patent Application No. 2016-254287, filed on Dec. 27, 2016, the disclosure of which is hereby incorporated by reference in its entirety.

BACKGROUND

1. Field of the Invention

The present disclosure relates to a method of manufacturing a light-emitting device.

2. Description of Related Art

Light-emitting devices employing light-emitting elements such as semiconductor light-emitting elements are widely used. In particular, light-emitting devices have been provided that are configured to emit, for example, white light, the color of which is a mixture of a color of light emitted from a light-emitting element and a color of light emitted from a phosphor excited by the light from the light-emitting element. Such a light-emitting device includes a phosphor layer covering the light-emitting element. For example, see Japanese Unexamined Patent Application Publication No. 2007-116035 and Japanese Unexamined Patent Application Publication No. 2008-117976.

Such a phosphor layer is formed by electrodeposition or the like. During formation of the phosphor layers using electrodeposition or the like, if a thickness of a phosphor layer is excessively increased due to a large amount of the phosphor, a portion of the phosphors may be removed by blowing air or the like on the phosphor layers.

However, by removing the phosphor, relative amount of the phosphor in the removed regions is reduced, which may cause unevenness in emission color of the light-emitting devices.

One object of the present invention is to provide a method of manufacturing a light-emitting device in which unevenness in emission color is reduced.

SUMMARY

A method of manufacturing a light-emitting device according to one aspect of the present invention includes: providing a light-emitting element, the light-emitting element including a layered semiconductor comprising an active layer located on a first region in a plan view of the light-emitting element, wherein the active layer is not visible from outside in a top view; mounting the light-emitting element on a supporting member; forming a phosphor layer so as to cover the light-emitting element; determining a surplus portion of the phosphor layer; and removing the phosphor layer at least partially from a second region which the active layer is not disposed in the plan view of the light-emitting element.

With the above-mentioned embodiment, unevenness in color can be reduced while controlling the shift in the emission color by removing the surplus of the phosphor layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DESCRIPTION

Figure 1:
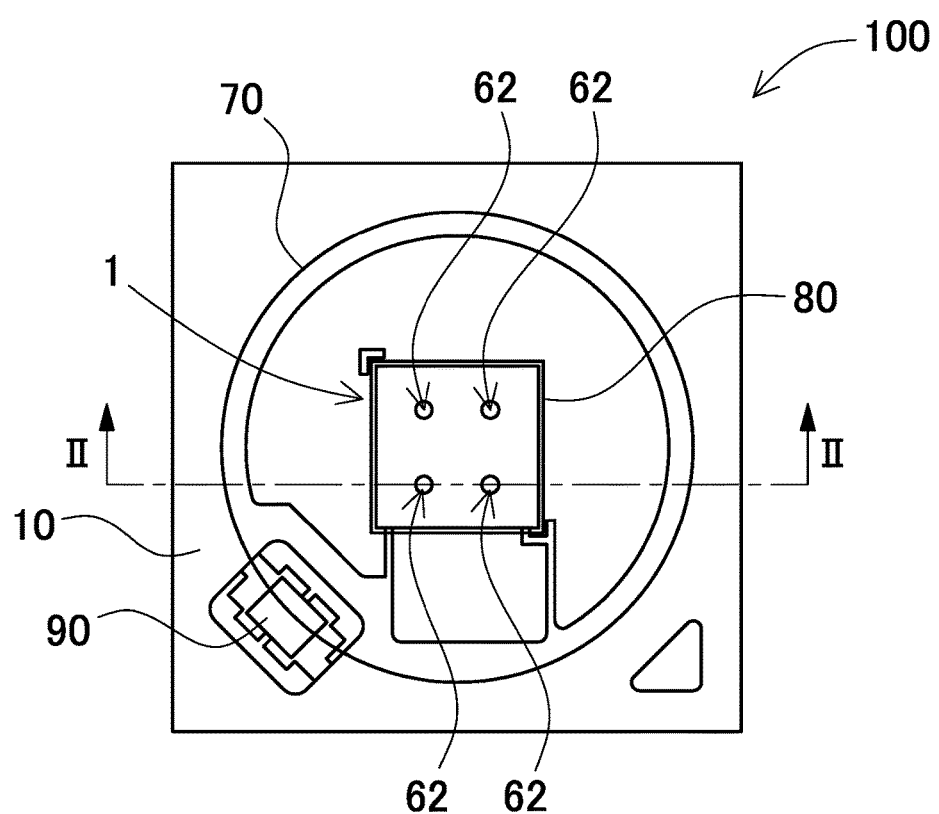
FIG. 1 is a schematic plan view of a light-emitting device according to a first embodiment according to the present disclosure.

Certain embodiments and examples of the present invention will be described below on the basis of the accompanying drawings. The embodiments below are examples intended to give a concrete form to the technical concept of the present invention and are not intended to limit the present invention to the description in the embodiments below. It should be noted that sizes or positional relationships of members illustrated in each drawing may be exaggerated in order to clarify the descriptions. Furthermore, in the descriptions below, the same name or the same reference numeral represents the same member or a member made of the same material, and its duplicative description will be omitted as appropriate. As for each element that constitutes the embodiments of the present invention, a plurality of elements may be formed of one member so that the member serves as the plurality of elements, or conversely, a combination of a plurality of members may fulfill the function of one member. Constitutions described in one embodiment may be applicable another embodiment.

A method of manufacturing a light-emitting device according to an embodiment of the present invention includes: providing a light-emitting element that includes a layered semiconductor including an active layer located on a first region in a plan view of the light-emitting element, wherein the active layer is not visible from outside in a top view; mounting the light-emitting element on a supporting member; forming a phosphor layer so as to cover the light-emitting element; determining a surplus portion of the phosphor layer; and removing the phosphor layer at least partially from a second region which the active layer is not disposed in the plan view of the light-emitting element.

In the step of removing the phosphor layer, the phosphor layer may be removed by spraying a liquid or a gas.

In the step of removing the phosphor layer, an alcohol may be used for the liquid.

In the step of removing the phosphor layer, an air may be used for the gas.

In the step of forming the phosphor layer, the phosphor layer may be formed by electrodeposition, a spraying technique, or electrostatic coating.

In the step of determining a surplus portion of the phosphor layer, the light-emitting element may be turned on.

The step of determining the surplus portion of the phosphor layer may include measuring a spectral component of an emission color while the light-emitting element is turned on, determining a shift amount of a peak wavelength of a phosphor from a desired wavelength, and calculating an amount of the phosphor layer to be removed based on the shift amount.

The method may further include a step of forming a covering member over the phosphor layer after the step of removing the phosphor layer.

First Embodiment

Each of FIG. 1 to FIG. 6 shows a light-emitting device according to a first embodiment of the present invention. A light-emitting device 100 includes a light-emitting element 1, a supporting member 10 having an upper surface and supporting the light-emitting element 1 on the upper surface, and a phosphor layer 60 that covers the light-emitting element 1 on the supporting member 10.

Supporting Member 10

On the supporting member 10, the light-emitting element 1 is mounted. The supporting member 10 includes an insulating base substrate and an electrically-conductive member such as a wiring pattern on the surface of the base substrate. The electrically-conductive member is used for mounting the light-emitting element 1.

In the case where a wiring pattern is used for the electrically-conductive member, a member can be used that is made by, for example, forming on a surface of a base material a reflective film containing silver made of a single layer or a layered body of silver, copper, nickel, palladium, rhodium, tungsten, chromium, titanium, aluminum, gold, or their alloys.

Examples of a material of the insulating base substrate of the supporting member 10 include a ceramic material and a resin (including fiber-reinforced resins). Examples of such a ceramic material include alumina and aluminum nitride. Examples of such a resin include thermosetting resins such as epoxy resins, silicone resins, BT resins, polyimide resins, and unsaturated polyester resins; thermoplastic resins such as polyphthalamide resin and nylon resins; and modified resins of these resins and hybrid resins each containing at least one of these resins. The base substrate may have a single-layer structure or a layered structure. The base substrate may contain a colorant, filler, or reinforcing fiber known in the field of the present invention. In particular, for a preferable colorant a material having a good reflectance, and a white material, such as titanium oxide and zinc oxide, is preferably used. Examples of the filler include silica and alumina. Examples of the reinforcing fiber include glass, calcium silicate, and potassium titanate.

Figure 2:
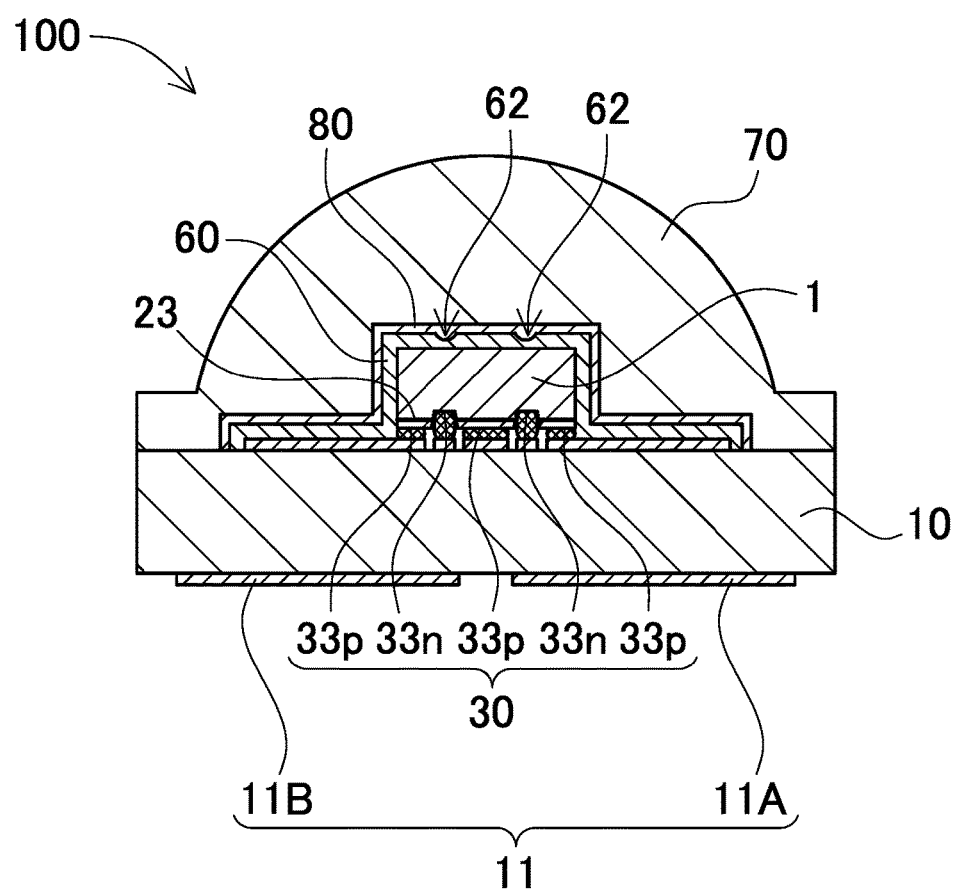
FIG. 2 is a schematic cross-sectional view taken along the line II-II in FIG. 1.
Figure 3:
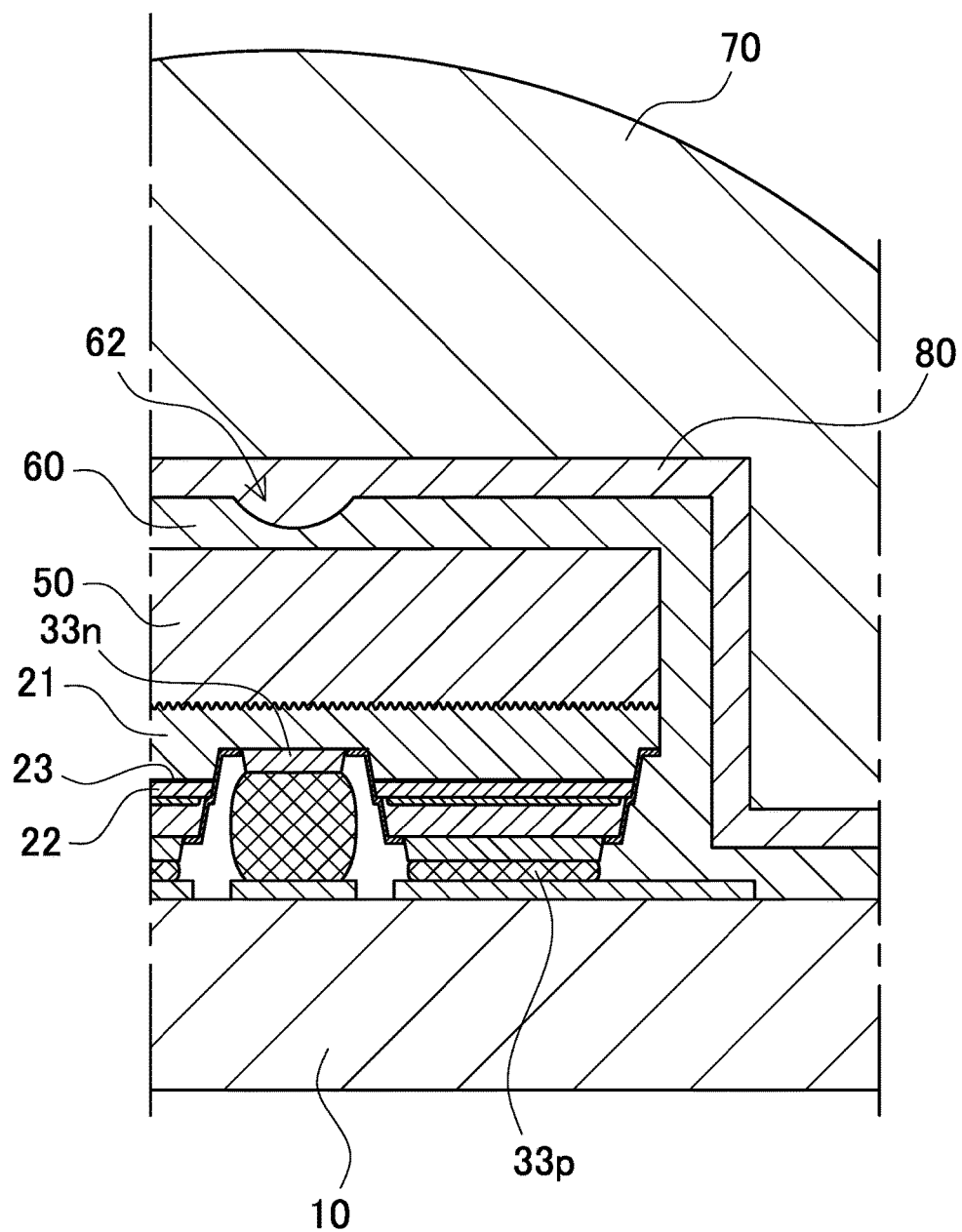
FIG. 3 is a schematic enlarged cross-sectional view of a main part of FIG. 2.
Figure 4:
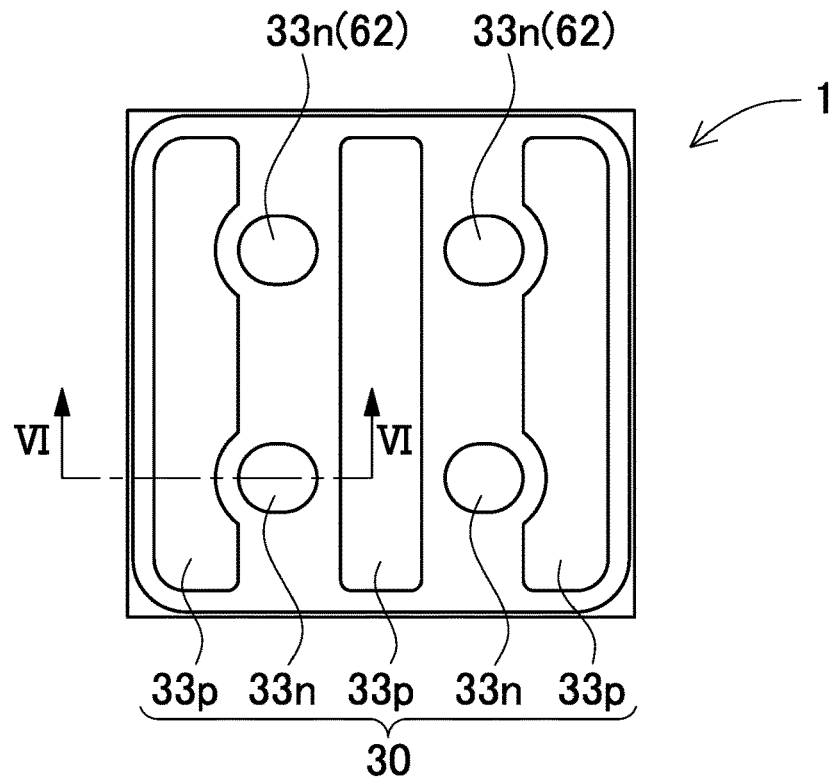
FIG. 4 is a schematic plan view of a light-emitting element in FIG. 2 viewed from a back surface side.
Figure 5:
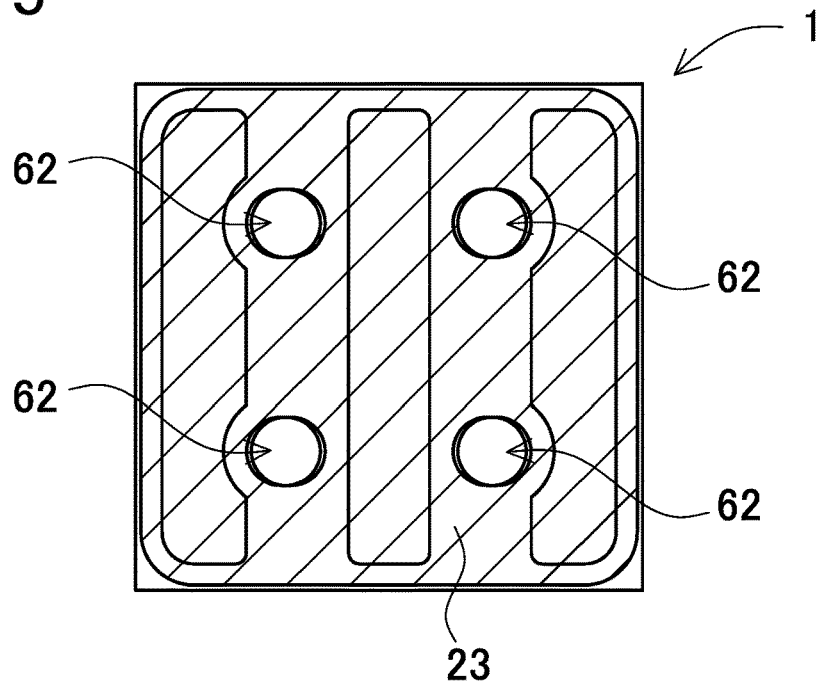
FIG. 5 is a schematic plan view illustrating a non-active-layer region of the light-emitting element in FIG. 4.

In an example shown in FIG. 1, FIG. 2, and FIG. 3, the electrically-conductive member is a wiring pattern, and the base substrate is made of a ceramic. A plurality of electrode terminals 11 are disposed on a back surface of the supporting member 10. The plurality of electrode terminals 11 include a first electrode terminal 11A to be connected to first electrodes described below via bonding members and a second electrode terminal 11B connected to second electrodes via bonding members. In addition, a protective element 90 is mounted as appropriate on the supporting member 10 as shown in FIG. 1. A Zener diode or the like can be used for the protective element 90.

Light-Emitting Element 1

Figure 6:
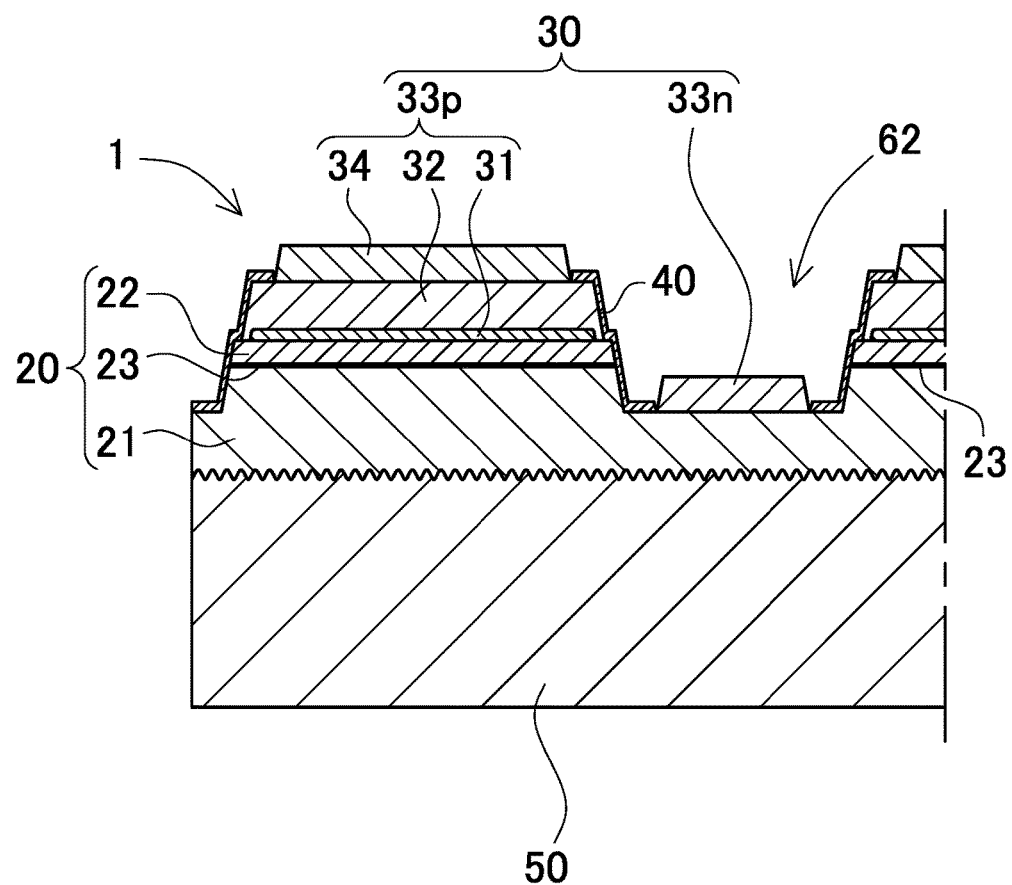
FIG. 6 is a schematic cross-sectional view of the light-emitting element in FIG. 4 taken along the line VI-VI.

A known semiconductor element made of a nitride semiconductor or the like can be used for the light-emitting element 1. The emission wavelength of the light-emitting element can be selected from the ultraviolet range as well as from the visible range (380 nm to 780 nm). The light-emitting element 1 includes a substrate 50, a layered semiconductor 20, and electrodes 30 as shown in FIG. 6.

The substrate 50 is a growth substrate for growing the layered semiconductor 20 on an upper surface thereof. For example, a sapphire can be preferably used.

The layered semiconductor 20 includes a first conductive-type semiconductor layer 21, an active layer 23, and a second conductive-type semiconductor layer 22 layered in this order from the upper surface of the substrate 50. The active layer 23 is disposed on a predetermined region of the upper surface of the first conductive-type semiconductor layer 21. In other words, the layered semiconductor 20 partially contains the active layer 23 in a plan view.

In a plan view, the layered semiconductor includes a first region and a second region. The first region is an active layer region, in which the active layer is disposed, and the second region is non-active-layer regions 62, in which no active layer is disposed. The second conductive-type semiconductor layer 22 is disposed on the upper surface of the active layer 23.

Various semiconductors such as group III-V compound semiconductors may be used for the first conductive-type semiconductor layer 21, the active layer 23, and the second conductive-type semiconductor layer 22. Specific examples of such semiconductors include nitride semiconductors represented by $In_XAl_YGa_{1-X-Y}N$ ($0 \leq X$, $0 \leq Y$, $X+Y \leq 1$), such as InN, AlN, GaN, InGaN, AlGaN, and InGaAlN. A thickness and layer structure known in the field of the invention can be employed for each layer.

In a plan view, the light-emitting element 1 preferably has a shape of a polygon, such as a substantially square shape and a substantially regular hexagonal shape. Such a shape allows for increasing efficiency of extraction of light from the light-emitting element in the case where a hemispherical lens is disposed on or above the light-emitting element. In the present specification, the expression "a substantially square shape" allows a variation in an angle of ±5° at each of the four 90° corners. Further, the expression "a substantially regular hexagonal shape" allows a variation in an angle of ±5° at each of the four 120° corners. Each of the sides forming the plan view shape of the light-emitting element is generally a straight line, but each side may be curved or bent to some degree depending on the precision of processing and the like of the semiconductor layers. The upper limit of the degree of being curved or bent can be appropriately adjusted in accordance with the size of the light-emitting element or desired properties of the light-emitting element. For example, in the case where the light-emitting element has a substantially quadrilateral shape in a plan view, a side of the light-emitting element may have a length of about 200 μm to 3 mm. In the case where the light-emitting element has a substantially hexagonal shape, a side of the light-emitting element may have a length of about 100 μm to 2 mm.

The electrodes 30 are disposed on an upper surface of the layered semiconductor 20. The electrodes 30 include first electrodes 33n electrically connected to the first conductive-type semiconductor layer 21 and second electrodes 33p electrically connected to the second conductive-type semiconductor layer 22. For example, the electrodes 30 of the light-emitting element 1 are flip-chip connected to the electrically-conductive member of the supporting member 10.

Each of the second electrodes 33p includes a whole-surface electrode 31, a cover electrode 32, and a pad electrode 34 as shown in FIG. 6. Each of the first and second electrodes can be, for example, a single-layer film or multilayered film made of a metal such as Au, Pt, Pd, Rh, Ni, W, Mo, Cr, Ti, or an alloy of two or more of these. Specific examples thereof include a layered film such as Ti/Rh/Au, W/Pt/Au, Rh/Pt/Au, W/Pt/Au, Ni/Pt/Au, and Ti/Rh, layered from the layered semiconductor 20 side.

Figure 7:
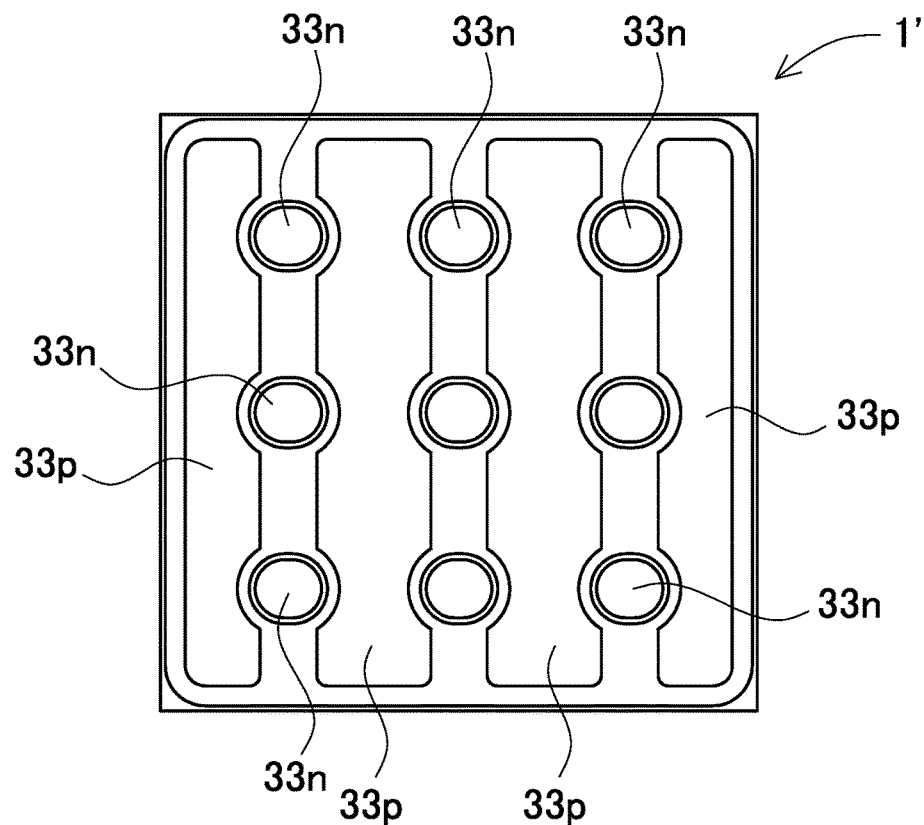
FIG. 7 is a schematic plan view of a light-emitting element according to another example according to the present disclosure.

The shapes and numbers of the first and second electrodes can be adjusted appropriately. For example, in FIG. 4, a total of four first electrodes 33n are arranged in a two-by-two matrix, and three second electrodes 33p each having a bar-like shape are arranged. Alternatively, for example, a total of nine first electrodes 33n may be arranged in a three-by-three matrix, and four second electrodes 33p each having a bar-like shape may be arranged, as in a light-emitting element 1' according to a variant example shown in FIG. 7.

An insulating protective film 40 covers a surface of the layered semiconductor 20 except for the upper surfaces of the first electrodes 33n and the second electrodes 33p. SiO$_2$ or the like can be preferably used for the protective film 40. In the present embodiment, the first conductive-type semiconductor layer 21 is an n-side semiconductor layer, the second conductive-type semiconductor layer 22 is a p-side semiconductor layer, the first electrodes 33n are n-electrodes, and the second electrodes 33p are p-electrodes.

Phosphor Layer 60

The phosphor layer 60 contains particles of a phosphor adapted to convert light having a first peak wavelength emitted from the active layer of the light-emitting element into light having a second peak wavelength different from the first peak wavelength. The phosphor layer 60 is disposed at least on an upper surface of the light-emitting element 1. The phosphor layer 60 may cover lateral surfaces of the light-emitting element and/or the electrically-conductive member of the supporting member. As shown in, for example, FIG. 2, on the upper surface of the light-emitting element, a portion of the phosphor in the phosphor layer 60 is removed in the non-active-layer regions 62, each of which is a region in a plan view in which the active layer is not disposed. In other words, a portion of the phosphor layer in the non-active-layer regions 62 has a thickness smaller than a thickness of the phosphor layer in the region in which the active layer is disposed.

The light-emitting element emits light having the first peak wavelength from the active layer thereof. Accordingly, on the upper surface of the light-emitting element, intensity of light having the first peak wavelength is greater in the active layer region, in which the active layer is disposed, than in the non-active-layer regions, in which no active layer is disposed. Partially removing the phosphor layer allows for reducing light having the second peak wavelength generated by excitation of the phosphor layer, and thus intensity of light having the first peak wavelength in those regions is increased. In the present embodiment, the phosphor layer is partially removed not in the active layer region where intensity of light having the first peak wavelength is greater but in the non-active-layer regions where intensity of the light having the first peak wavelength is smaller in a plan view, so that increase in intensity of light of the first peak wavelength in the regions where the phosphor layer is partially removed can be prevented, compared with the case where the phosphor layer in the active layer region is removed. Accordingly, unevenness in color of the light-emitting device is reduced. In other words, on the upper surface of the light-emitting element, partially removing the phosphor layer in the active layer region, where intensity of light having the first peak wavelength is greater, allows for further increasing intensity of light having the first peak wavelength, which tends to cause unevenness in color of the light-emitting device.

Figure 8:
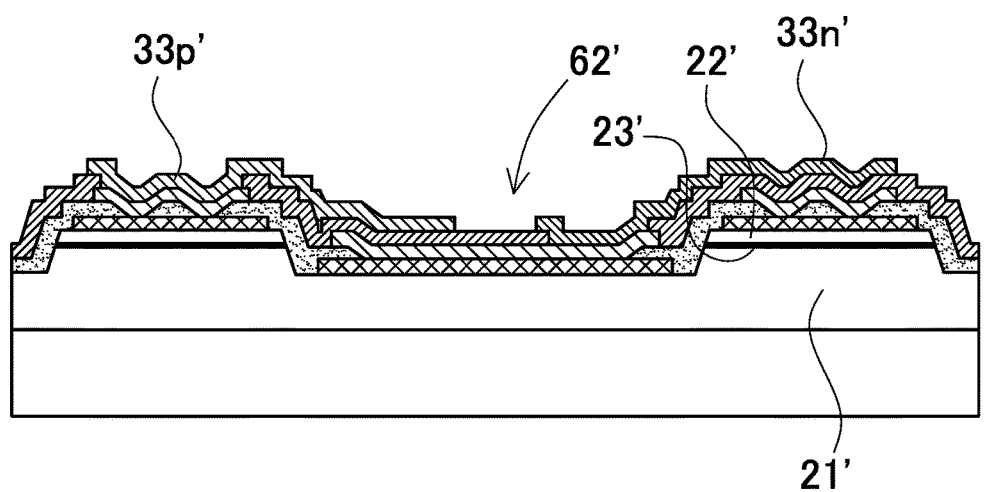
FIG. 8 is a schematic cross-sectional view of a light-emitting element according to second embodiment.

In the regions where the phosphor layer 60 is partially removed, the upper surface of the light-emitting element is preferably not exposed out of the phosphor layer. That is, in the non-active-layer regions 62, in which no active layer is disposed, the phosphor layer 60 is preferably thinned to the extent that the phosphor remains at an amount that allows for preventing the upper surface of the light-emitting element 1 from being exposed. This allows for preventing reduction in amount of light having the second peak wavelength compared with the case where the upper surface of the light-emitting element is exposed out of the phosphor layer, so that unevenness in color of the light-emitting device can be reduced. The thickness of the phosphor layer in the regions where the phosphor layer 60 is partially removed is preferably greater than a half of the maximum thickness of the phosphor layer on the upper surface of the light-emitting element. With such a thickness, reduction in the amount of light having the second peak wavelength can be prevented, so that unevenness in color of the light-emitting device can be reduced. The non-active-layer regions 62 are regions in which the active layer has been removed by etching or the like in order to expose the n-side semiconductor layer during, for example, manufacturing the light-emitting element 1. For example, in the plan view of FIG. 5, the regions in which the first electrodes 33n are disposed can be referred to as the non-active-layer regions 62, while the hatched area is the region in which the active layer 23 is disposed. Alternatively, in a light-emitting element according to another embodiment shown in FIG. 8 where first electrodes 33n' are extended over the upper surface of a second conductive-type semiconductor layer 22', not an entirety of the regions in which the first electrodes 33n' are disposed corresponds to non-active-layer regions 62', in which no active layer 23' is disposed. In such a case, the non-active-layer regions 62' are not limited to the regions in which the first electrodes 33n' are disposed, but may refer to other regions, such as the regions in which a first conductive-type semiconductor layer 21' (for example, an n-type semiconductor layer) is exposed by etching of the semiconductor layer in the case shown in FIG. 8. The second conductive-type semiconductor layer 22' is connected to second electrodes 33p'.

Examples of phosphors used for the phosphor layer include nitride-based phosphors or oxynitride phosphors activated by lanthanoid series element such as Eu or Ce. More specific examples of such phosphors includes: alpha-sialon or beta-sialon phosphors activated by Eu; various alkaline-earth metal nitridosilicate phosphors; alkaline-earth metal halogen apatite phosphors, alkaline-earth halosilicate phosphors, alkaline-earth metal silicate phosphors, alkaline-earth metal haloborate phosphors, alkaline-earth metal aluminate phosphors, alkaline-earth metal silicate phosphors, alkaline-earth metal sulfide phosphors, alkaline-earth metal thiogallate phosphors, alkaline-earth metal silicon nitride phosphors, and germanate phosphors mainly activated by lanthanoid element such as Eu or transition metal element such as Mn; rare-earth aluminate and rare-earth silicate phosphors activated by lanthanoid element such as Ce; and organic phosphors and organic complex phosphors activated by lanthanoid element such as Eu.

Impregnation Layer 80

After partially removing the phosphor layer in the non-active-layer regions, an impregnation layer 80 is preferably formed so as to cover the phosphor layer to prevent detachment of the phosphor layer 60. A portion of the impregnation layer 80 is impregnated with the phosphor layer 60. A light-transmissive material, such as a silicone resin or an epoxy resin, can be used for a material of the impregnation layer.

Covering Member 70

The covering member 70 covers the upper surface of the phosphor layer 60 to encapsulate the light-emitting element 1. Any appropriate material can be used for the covering member 70, and examples of such a material include polycarbonate resins, epoxy resins, phenolic resins, silicone resins, acrylic resins, TPX, polynorbornene resins, modified resins of these resins, and hybrid resins each containing at least one of these resins.

The covering member 70 may have any appropriate shape, and the covering member 70 preferably has a substantially hemispherical lens portion. The lens portion allows for reducing reflection component of light emitted from the light-emitting element 1 at the interface between the lens portion and the air due to a large incident angle compared to a plate-shaped covering member without a lens portion, thereby improving the light extraction efficiency.

The covering member may be formed using any appropriated method such as compression molding, injection molding, or the like. Alternatively, the lens portion may be formed using surface tension of the covering member itself by dropping of or drawing a material of the covering member with an optimized viscosity on the light-emitting element.

Method of Manufacturing Light-Emitting Device 100

Figure 9:
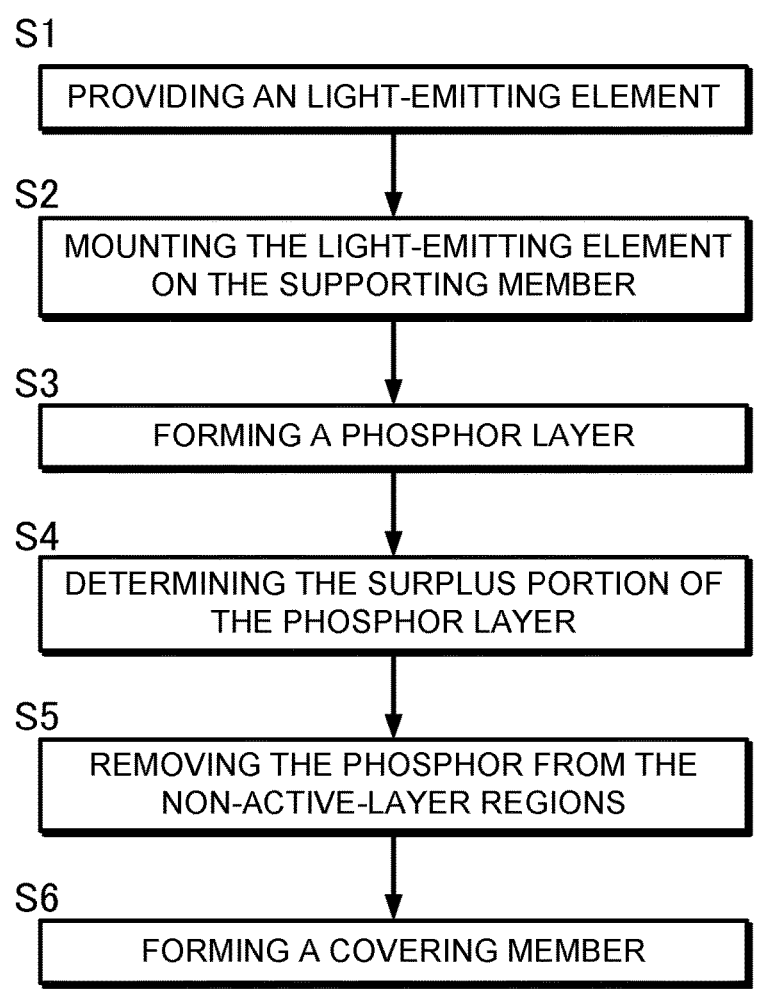
FIG. 9 is a flowchart illustrating a method of manufacturing the light-emitting device according to the first embodiment of the present invention.
Figure 10:
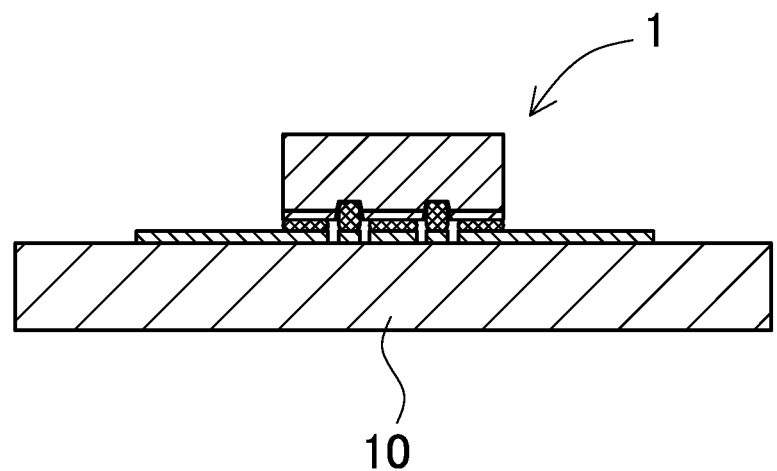
FIG. 10 is a schematic cross-sectional view illustrating a state in which the light-emitting element is mounted on a supporting member.

A method of manufacturing the light-emitting device 100 is described on the basis of the flowchart of FIG. 9. First, in Step S1, the light-emitting element 1 is provided. Subsequently, in Step S2, the light-emitting element 1 is disposed on the supporting member 10. The light-emitting element 1 is mounted on and fixed to the supporting member 10 as shown in FIG. 10.

Figure 11:
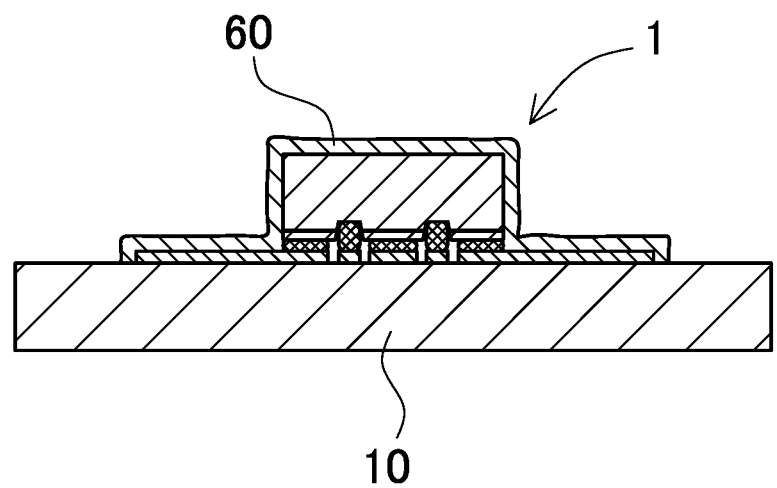
FIG. 11 is a schematic cross-sectional view illustrating a state in which a phosphor layer has been formed on the surface of a layered semiconductor.

In Step S3, the light-emitting element 1 is covered with the phosphor layer 60. The phosphor layer 60 preferably has a uniform thickness at a portion thereof covering the surfaces of the light-emitting element 1. Such a structure allows for reducing unevenness in color of the light-emitting device. The phosphor layer 60 is preferably formed by electrodeposition, spraying, or electrostatic coating. Forming the phosphor layer 60 in such a manner allows the thickness of the layer to be uniform easily compared with the case where the phosphor layer is formed by application thereof. The light-emitting element 1 on the supporting member 10 is thus substantially uniformly covered with the phosphor layer 60 as shown in FIG. 11.

Figure 12:
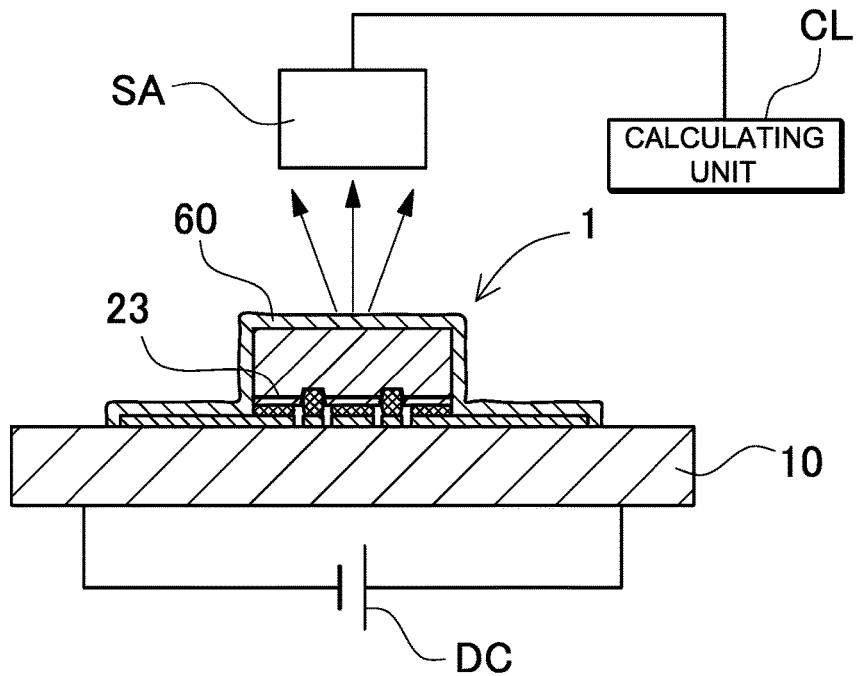
FIG. 12 is a schematic diagram illustrating determination of the surplus portion of the phosphor layer.

Subsequently, in Step S4, the surplus portion of the phosphor layer 60 is determined. In this step, the light-emitting element 1 is turned on and its emission color is measured as shown in FIG. 12. For example, the positive and negative electrodes of the supporting member 10 are connected to a direct-current power source DC to turn on the light-emitting element 1. A spectral measuring device SA that can measure the emission spectrum is disposed above the emitting surface of the light-emitting element 1, and the results of the measurement with the measuring device SA is analyzed with a calculating unit CL. A shift amount of the peak wavelength of the phosphor from a desired wavelength that is designed is measured among the spectral components of light emitted from the light-emitting element 1. The amount of the phosphor layer 60 to be removed is calculated with the calculating unit CL on the basis of the shift amount.

Figure 13:
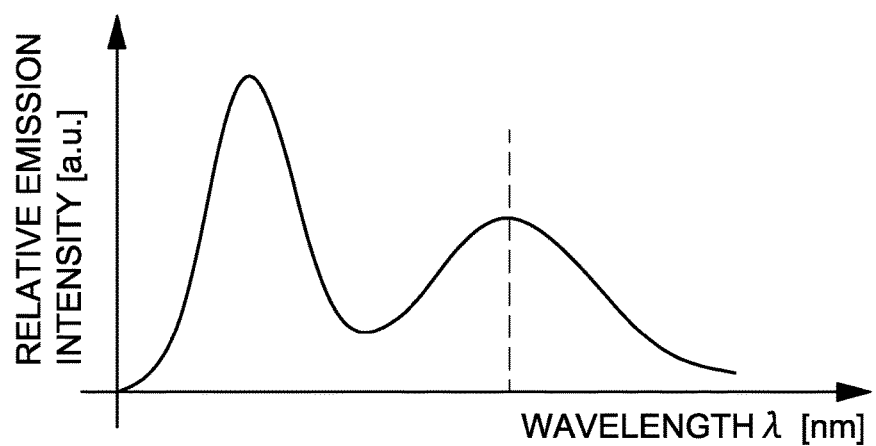
FIG. 13 is an emission spectrum of the light-emitting element.

For example, it is assumed that a light-emitting device configured to emit white light as a mixture of blue light and yellow light is provided by using a blue light-emitting diode as the light-emitting element and using a YAG phosphor as the phosphor layer, which is excited by the blue light emitted from the blue light-emitting diode and emits the yellow fluorescent light. In this case, if a too large amount of the phosphor is applied, a component of yellow light emitted from the phosphor layer is increased, so that the light-emitting device outputs yellowish light (i.e., light including a relatively small blue component). For example, in the case where an emission spectrum as shown in FIG. 13 is measured, the spectrum corresponding to the phosphor is great in the spectrum, so that and it is required that the amplitude of the emission peak is reduced or that the emission peak shifts to shorter wavelengths. To achieve this reduction or shifting, partially removing the phosphor from the phosphor layer that has been formed is considered so that the amount of the phosphor can be reduced.

It is difficult to uniformly removing the phosphor from the phosphor layer applied with a substantially uniform thickness. Conventionally, the phosphor is partially blown off by spraying pressurized air. However, partially removing the phosphor allows the phosphor layer in each of the removed regions to be partially thin, and the intensity of component of light emitted from the light-emitting element may be increased. Hence, unevenness in color, that is, the emission color is partially different, may be caused.

In the present embodiment, to provide a light-emitting device that exhibits reduced unevenness in color even after a portion of the phosphor layer is removed, at least a portion of the phosphor layer in each of regions less contributing emission of light is removed, specifically, in regions other than regions in which the active layer of the light-emitting element is disposed, which allows for reducing unevenness in color of the light-emitting device.

In the present embodiment, the phosphor layer is partially removed not in the active layer region, where intensity of light having the first peak wavelength is great, but in the non-active-layer regions, where the light having the first peak wavelength is small, in a plan view. With this removal, increase in intensity of light having the first peak wavelength is prevented in the regions where the phosphor layer is partially removed compared with the case where the phosphor layer in the active layer region is removed, which allows for reducing unevenness in color of the light-emitting device.

The phosphor layer at positions in a plan view overlapping the first electrodes is preferably removed. The phosphor layer can be removed by, for example, spraying a liquid or a gas. The first electrodes are supported on the supporting member, the stress applied on the light-emitting element is smaller than in the case where the phosphor layer is removed in regions not overlapping the first electrodes.

Figure 14:
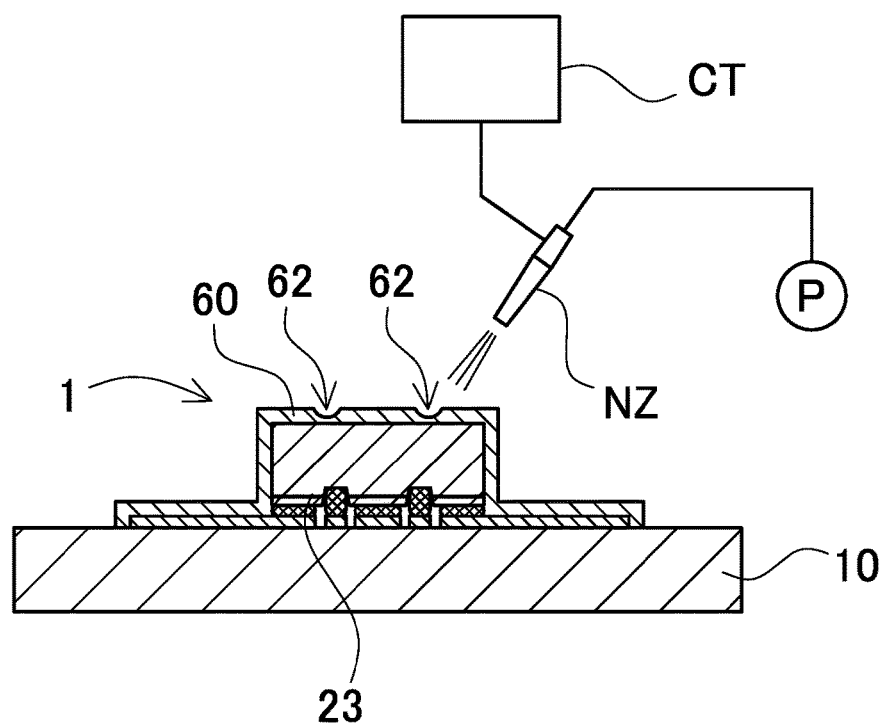
FIG. 14 is a schematic diagram illustrating partial removal of the surplus portion of the phosphor layer.

More specifically, in Step S5, at least a portion of the phosphor in each of the non-active-layer regions 62 in a plan view, in which the active layer is not disposed, is removed. For example, a liquid or a gas is sprayed from a spray nozzle NZ on the target regions of the phosphor layer 60 as shown in FIG. 14. The spray nozzle NZ is controlled by the calculating unit, a controller CT connected to the calculating unit, or the like. FIG. 14 shows an example in which a pressurized liquid is sprayed on the non-active-layer regions 62 in which the first electrodes 33n are located to achieve the removal.

A pressurized liquid or gas can be used as the medium to be sprayed. An alcohol is suitably used as the liquid. Examples of such alcohol include ethanol, methanol, and isopropanol. Alcohols are suitable because alcohols are easily evaporated after the removal and have a non-residual property. On the other hand, air can be preferably used for the gas.

The surplus of the phosphor is removed in this manner. Improvement in the emission spectrum as desired may be confirmed as appropriate by turning on the light-emitting element and measuring its emission color again.

After removing the surplus portion of the phosphor in this manner, the covering member 70 is formed so as to cover the phosphor layer 60 in Step S6. The impregnation layer 80 may be formed prior to form the covering member 70. The light-emitting device shown in, for example, FIG. 2 is thus provided.

The method of manufacturing the light-emitting device according to the embodiments of the present invention can be suitably applied to light sources for lighting apparatuses, LED displays, backlights for liquid-crystal displays and the like, signals, illuminated switches, various sensors and indicators, and other general light sources for consumer products.

Obviously, numerous modifications and variations of the present invention are possible in light of the above teachings. It is therefore to be understood that within the scope of the appended claims, the invention may be practiced otherwise than as specifically described herein.

What is claimed is:

1. A method of manufacturing a light-emitting device, the method comprising:
providing a light-emitting element including a first region in a plan view thereof and a second region other than the first region, the second region not having an active layer disposed in the plan view of the light-emitting element, the light-emitting element including a layered semiconductor comprising the active layer located on the first region but not on the second region in the plan view of the light-emitting element, wherein the active layer is not visible from outside in a top view;
mounting the light-emitting element on a supporting member;
forming a phosphor layer so as to cover the light-emitting element;
determining a surplus portion of the phosphor layer; and
removing the phosphor layer at least partially from the second region in the light-emitting element.

2. The method of manufacturing a light-emitting device according to claim 1, wherein, in the step of removing the phosphor layer, the phosphor layer is removed by spraying a liquid or a gas.

3. The method of manufacturing a light-emitting device according to claim 2, wherein the liquid comprises an alcohol.

4. The method of manufacturing a light-emitting device according to claim 2, wherein the gas comprises air.

5. The method of manufacturing a light-emitting device according to claim 1, wherein the phosphor layer is formed by electrodeposition, spraying, or electrostatic coating.

6. The method of manufacturing a light-emitting device according to claim 1, wherein, in the step of determining a surplus portion of the phosphor layer, the light-emitting element is turned on.

7. The method of manufacturing a light-emitting device according to claim 6,
wherein the step of determining a surplus portion of the phosphor layer comprises:
measuring a spectral component of an emission color in a state where the light-emitting element is turned on;
determining a shift amount of a peak wavelength of a phosphor from a desired wavelength; and
calculating an amount of the phosphor layer to be removed based on the shift amount.

8. The method of manufacturing a light-emitting device according to claim 1, the method further comprising forming a covering member so as to cover the phosphor layer after removing the phosphor layer.

* * * * *